United States Patent [19]

Kaji et al.

[11] 4,109,167
[45] Aug. 22, 1978

[54] TRANSISTOR AMPLIFIER APPLYING LARGE OUTPUT CURRENTS TO A LOAD

[76] Inventors: Isamu Kaji, 48-38, Yamashina-Higashino-Yashiro, Higashiyama-ku, Kyoto; Naoyuki Maeda, 671-1, Aza Higashikoken, Oaza Inuyama, Inuyama-shi, Aichi-ken, both of Japan

[21] Appl. No.: 754,954

[22] Filed: Dec. 28, 1976

[30] Foreign Application Priority Data

May 21, 1976 [JP] Japan .................................. 51-58841

[51] Int. Cl.[2] ............................................ H03K 17/00
[52] U.S. Cl. .................................. 307/270; 307/254; 307/315; 307/314
[58] Field of Search ............... 307/314, 315, 254, 270; 357/46

[56] References Cited

U.S. PATENT DOCUMENTS

| 3,273,050 | 9/1966 | Pratt | 307/314 |
| 3,612,909 | 10/1971 | Imabayashi | 307/315 |

FOREIGN PATENT DOCUMENTS

| 318,161 | 1/1972 | U.S.S.R. | 307/315 |

Primary Examiner—Stanley D. Miller, Jr.
Assistant Examiner—B. P. Davis
Attorney, Agent, or Firm—Karl F. Ross

[57] ABSTRACT

The primary winding of an output transformer, having a secondary winding connected across a spark gap or other load, is divided into a main coil and at least one counteracting coil with a reduced number of turns connected in series opposition across a source of direct current. An amplifier in the primary circuit, to which a train of voltage pulses may be fed, comprises at least two stages formed by a driving transistor in series with the counteracting coil and a power transistor in series with the main coil, the transistors being interconnected in a Darlington configuration. The countervailing voltages appearing across the two coils produce between the collectors of these transistors a voltage difference which intensifies the collector current of the driving transistor to insure full saturation of the power transistor in a conduction phase. In the case of a multistage Darlington configuration, an intermediate transistor may have its own ancillary coil in series with the others or may be connected to a tap on the counteracting or booster coil feeding the input transistor.

9 Claims, 7 Drawing Figures

TRANSISTOR AMPLIFIER APPLYING LARGE OUTPUT CURRENTS TO A LOAD

FIELD OF THE INVENTION

Our present invention relates to a transistor amplifier designed to energize a load by way of an output transformer.

In conventional semiconductor circuitry for obtaining a large output current from a relatively small input current, a compound transistor amplifier of the Darlington type is generally used. In the Darlington connection the emitter output of an input or driving transistor is directly connected to the base of an associated power transistor and the collectors of the two transistors are connected to a common junction so as to be at the same potential. The net current-amplification factor becomes the product of the DC amplification factors of the individual transistor stages.

Thus, the overall amplification factor of the Darlington configuration becomes very high, but since it is a kind of emitter-follower connection, its input impedance may reach several tens of KΩ or more. Accordingly, the emitter current of the driving transistor is small and the overall DC amplification factor is smaller than what is theoretically expected.

When an instantaneous large current is intermittently applied to a load from a source of relatively low voltage, since the voltage drop across the saturation resistance is large compared with the source voltage even with a large input signal, the saturation potential of the collectors of the driving transistor and the power transistor cannot be as low as desired. This results in a large temperature rise due to energy dissipation by the collector current of the power transistor which tends to cause transistor breakdown so that a large load output cannot be produced.

OBJECT OF THE INVENTION

An object of the present invention is to provide an improved semiconductor device including a Darlington configuration as described above whose power transistor is in series with a load coil constituting the primary winding of an output transformer.

SUMMARY OF THE INVENTION

We realize this object by providing an ancillary coil connected between the collector of the driving transistor and the collector of the power transistor. The ancillary coil is wound in series-opposed relationship with a main or energizing coil on the core of the output transformer so as to generate a magnetic flux tending to oppose the larger flux generated by the main coil, thereby establishing a potential difference between the two collectors. This potential difference is utilized to reduce the energy dissipation of the collector current by completely saturating the power transistor.

BRIEF DESCRIPTION OF THE DRAWING

The above and other features of our invention will now be described with reference to the accompanying drawing in which.

SPECIFIC DESCRIPTION

Figure 1:
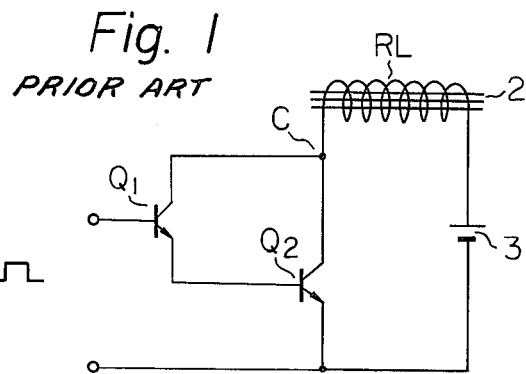
FIG. 1 is a circuit diagram of a conventional Darlington-type circuit.

In FIG. 1 we have shown a prior-art transistor amplifier of the type discussed above, including a first-stage or driving transistor $Q_1$ connected in a Darlington configuration to a second-stage or power transistor $Q_2$. The collectors of both transistors are connected to a common source 3 of DC voltage via a junction C and a transformer winding RL on a core 2. The input terminals of the amplifier, constituted by the base lead of stage $Q_1$ and the emitter lead of stage $Q_2$, are connected across a nonillustrated generator of pulses 1.

Figure 2:
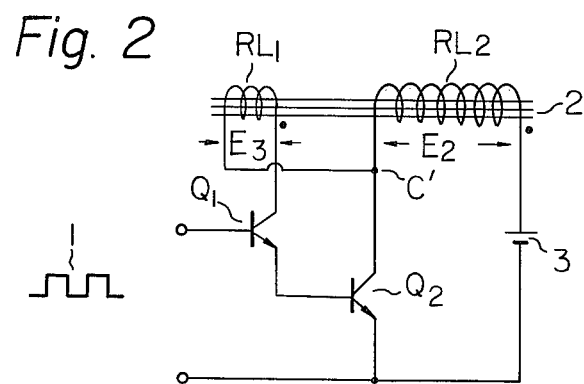
FIG. 2 is a circuit diagram of a semiconductor device according to the present invention.

In FIG. 2, a counteracting ancillary coil $RL_1$ and a main coil $RL_2$ with a larger number of turns are oppositely wound on a core 2 of an output transformer. One terminal of coil $RL_2$ is connected to a DC source 3 and one terminal of coil $RL_1$ is connected to the collector of first-stage or driving transistor $Q_1$. The other terminals of the two coils are connected to a common junction C' on the collector of second-stage or power transistor $Q_2$. When an input signal 1 is applied to render the two transistors $Q_1$ and $Q_2$ conductive, a voltage $E_3$ of a polarity opposite that of a load voltage $E_2$ is developed across coil $RL_1$ an account of the excitation of coil $RL_2$.

The number of turns of the counteracting ancillary coil $RL_1$ is less than that of coil $RL_2$ and is selected so that the voltage $E_3$ is equivalent to a voltage which remains after subtracting a saturation voltage $CE_2$ of the power transistor $Q_2$ from the sum of a saturation voltage $CE_1$ of the driving transistor $Q_1$ and a normal voltage drop BE in its base emitter path. In other words, it is desirable to make the voltage in the power stage which is expressed by $E_2 + CE_2$ substantially equal to the voltage in the driving stage which is expressed by $CE_1 + BE - E_3 + E_2$, where $E_1$ is the DC voltage of source 3 and $E_2$ is the voltage applied to the load coil $RL_2$. In the equivalent circuit of FIG. 3, a battery $E_3$, has been substituted for the induced voltage $E_3$ of FIG. 2.

Thus, a certain voltage difference exists between the two collectors. A current due to that voltage difference can be added to the collector current of transistor $Q_1$ to intensify the base current of the power transistor $Q_2$ for full saturation of the latter in a conductive phase so that, its collector loss and temperature rise are decreased to permit the flow of a large output current through the load.

Figure 4:
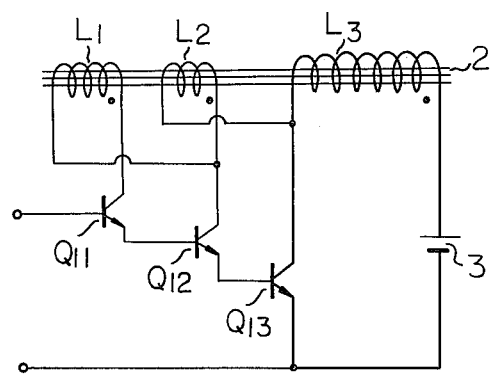
FIGS. 4 and 5 are circuit diagrams of a device according to our invention including a multistage amplifier.

In the multistage compound transistor circuit shown in FIG. 4, the turn numbers of three coils $L_1$, $L_2$ and $L_3$ wound on core 2 are selected in proportion to the saturation voltages of respective transistors $Q_{11}$, $Q_{12}$ and $Q_{13}$ so that corresponding potential differences are generated between the collectors thereof. Accordingly, the transistors saturate completely and a large output can be obtained with a small input signal.

Figure 5:
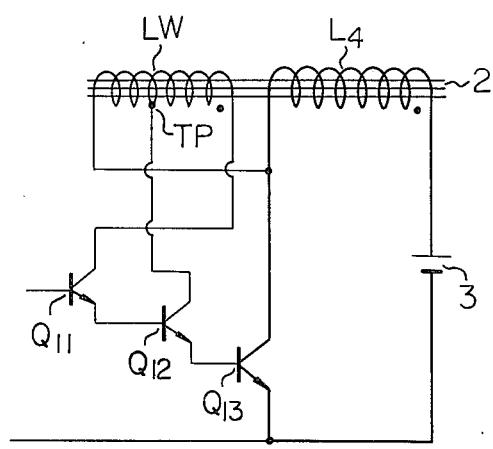

In the multistage circuit shown in FIG. 5, a booster coil LW consists of a single winding whose ends are connected to the collectors of the transistors $Q_{11}$ and $Q_{13}$. The coil LW has a tap TP connected to the collector of the intermediate transistor $Q_{12}$ driving the power transistor $Q_{13}$. This connection simplifies the construction of the transformer windings and the electrical power from the DC source 3 is efficiently applied to a main coil $L_4$ corresponding to winding $L_3$ in the circuit diagram shown in FIG. 4. The location of tap TP is so chosen as to bring about saturation of transistor stages $Q_{12}$ and $Q_{13}$.

Figure 6:
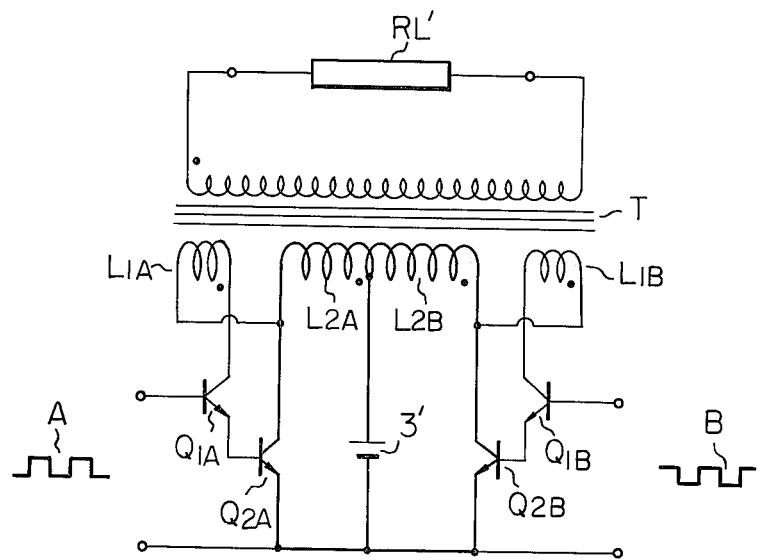
FIG. 6 is a circuit diagram of an AC-DC converter using semiconductor devices according to the present invention.

In FIG. 6, the collectors of two input transistors $Q_{1A}$ and $Q_{1B}$ are connected, respectively, to coils $L_{1A}$ and $L_{1B}$ on the primary side of a transformer T and the collectors of two power transistors $Q_{2A}$ and $Q_{2B}$ are connected, respectively, to main coils $L_{2A}$ and $L_{2B}$ energized from a common source 3'. A load RL' is connected across the secondary winding of the transformer T. The transistors $Q_{1A}$ and $Q_{1B}$ are connected, respectively, to the transistors $Q_{2A}$ and $Q_{2B}$ in a Darlington configuration so that the transistors $Q_{1A}$ and $Q_{1B}$ drive the transistors $Q_{2A}$ and $Q_{2B}$.

Figure 3:
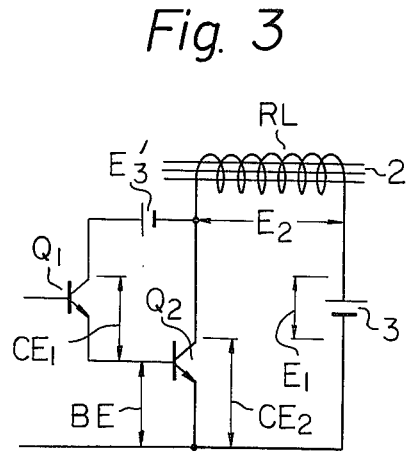
FIG. 3 is an equivalent circuit of the device shown in FIG. 2.

As explained in conjunction with the system of FIGS. 2 and 3, the two power transistors can be completely saturated to reduce the collector losses and, therefore, the electrical power from the DC source 3' is efficiently applied to the primary windings for transmission to the load RL'. The system of FIG. 6 operates as a DC-AC converter generating pulse trains A and B in its two alternately conducting branches $Q_{1A}$, $Q_{2A}$ and $Q_{1B}$, $Q_{2B}$.

Figure 7:
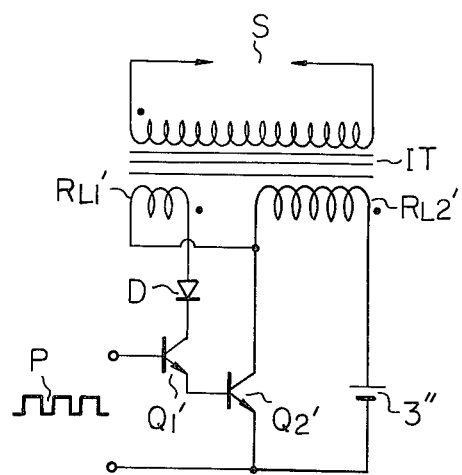
FIG. 7 is a circuit diagram of an electronic igniter using a semiconductor device according to the present invention.

In FIG. 7, a primary winding consisting of a booster coil $RL_1'$ and a main coil $RL_2'$ is wound on the core of a transformer IT whose secondary winding acts as an ignition coil for a spark gap S. The collectors of a driving transistor $Q_1'$ and a power transistor $Q_2'$ are again, respectively connected to the booster coil $RL_1'$ and main coil $RL_2'$. When a pulse P is applied to the input terminals of the amplifier, the transistors $Q_1'$ and $Q_2'$ conduct to energize the primary winding from a DC source 3", so that a potential difference appears between the two coils. A current due to this potential difference flows from the emitter of the driving transistor $Q_1'$ to the base of the power transistor $Q_2'$, the magnitude of that current being sufficient to saturate completely the collector-emitter circuit of the power transistor $Q_2'$ and to decrease the collector loss.

When the pulse P disappears, a high-voltage ignition pulse due to a large counter-e.m.f. is generated by the secondary winding of transformer IT since the voltage of the DC source 3" is effectively applied to the main coil $RL_2'$ of its primary. A spark-discharge voltage of relatively high energy is thus obtained at gap S.

A diode D inserted between the collector of the input transistor and the booster coil may prevent the application of reverse voltage to the collector-emitter circuit of this stage and to the base-collector circuit of the power transistor.

A diode may also be inserted in the converter circuit shown in FIG. 6 to prevent the flow of reverse current from the transformer primary to the transistor which happens to be cut off, so that a transistor with a low breakdown voltage relative to the available DC voltage can be utilized.

A circuit arrangement according to our invention can be widely applied in the energization of a load with a relatively large current in a converter, in an automotive igniter, in a chopper and in any other system using induction coils for this purpose.

What is claimed is:

1. In a circuit arrangement wherein a load is connected across a secondary winding of an output transformer having primary winding means wound on a core in series with a source of direct current and an amplifier consisting of a plurality of transistors comprising a driving transistor and a power transistor in a Darlington configuration, each of said transistors including an emitter, a collector and a base, the emitter of said driving transistor being tied to the base of said power transistor, the improvement wherein said primary winding means comprises a main winding and an ancillary winding connected in series opposition between said source and said amplifier, the collector of said power transistor being connected to a terminal of said main winding, the collector of said driving transistor being connected to said terminal by way of said ancillary winding, the emitter of said power transistor being connected to the other terminal of said main winding by way of said source, the turn ratio of said main and ancillary windings being such that said power transistor saturates in a conduction phase, the voltage developed across said ancillary winding in said conduction phase being substantially equal to the difference between the voltage across the main winding added to the source voltage and the combined collector/emitter voltage of said driving transistor and base/emitter voltage of said power transistor.

2. The improvement defined in claim 1 wherein the number of turns of said ancillary winding is less than that of said main winding.

3. The improvement defined in claim 1 wherein said transistors further include an input transistor having its emitter connected to the base of said driving transistor, the collector of said input transistor being connected to said primary winding means for saturating said driving transistor together with said power transistor.

4. The improvement defined in claim 3 wherein said primary winding means comprises a further ancillary winding in series opposition with said main winding connected to the collector of said driving transistor.

5. The improvement defined in claim 3 wherein the collector of said driving transistor is tied to a tap of said ancillary winding.

6. The improvement defined in claim 1, further comprising a protective diode in series with said ancillary winding.

7. A circuit arrangement for energizing a load, comprising:
an output transformer having a core;
first and second winding means on said core interconnected in series-opposed relationship;
a source of direct current connected to said first and second winding means; and
an input transistor, an intermediate transistor and a power transistor each having a collector, an emitter and a base, the collector and emitter of said power transistor being connected across said source in series with said first winding means, the collector and emitter of said intermediate transistor being connected in a Darlington configuration between said source and the base of said power transistor in series with said first winding means and a part of said second winding means, the collector and emitter of said input transistor being connected in a Darlington configuration between said source and the base of said intermediate transistor in series with said first and second winding means;

the turn ratio of said first and second winding means being such that said intermediate and power transistors saturate in a conduction phase.

8. A circuit arrangement as defined in claim 7 wherein said second winding means is divided into a pair of separate windings each inserted between the collectors of two of said transistors.

9. A circuit arrangement as defined in claim 7 wherein said second winding means is a coil having a tap connected to the collector of said intermediate transistor.

* * * * *